ARTHUR UHLIR JR.
INVENTOR.

BY Alfred H. Rosen
Lawrence P. Benjamin
ATTORNEYS

ARTHUR UHLIR, JR.
INVENTOR.
BY Alfred H Rosen
Lawrence P. Benjamin
ATTORNEYS

July 2, 1968 A. UHLIR, JR 3,391,346

IDLER CIRCUIT ENCAPSULATED IN PARAMETRIC OR TUNNEL DIODE SEMICONDUCTOR DEVICE

Filed May 15, 1964 3 Sheets-Sheet 3

ARTHUR UHLIR, JR.
INVENTOR.

BY Alfred H. Rosen
Lawrence P. Benjamin
ATTORNEYS

United States Patent Office 3,391,346
Patented July 2, 1968

1 2

3,391,346

IDLER CIRCUIT ENCAPSULATED IN PARAMETRIC OR TUNNEL DIODE SEMICONDUCTOR DEVICE

Arthur Uhlir, Jr., Weston, Mass., assignor to Microwave Associates, Incorporated, Burlington, Mass., a corporation of Massachusetts Filed May 15, 1964, Ser. No. 367,622
15 Claims. (Cl. 330—4.9)

ABSTRACT OF THE DISCLOSURE

Semiconductor varactor diodes are disclosed in combination with a circuit bridging the diode and tuned to an idler frequency for parametric or harmonic multiplier operation. The tuned circuit is of the same size approximately as the semiconductor body, and can be enclosed in the same housing or made integral with the semiconductor body.

This invention relates in general to semiconductor devices and more particularly to circuit assemblies in which the functions of a diode having voltage dependent capacitance characteristics and a tuned circuit with the necessary coupling thereto are achieved in a unitary device.

It is a well known phenomenon that the size of circuit elements must decrease in proportion to the increase in frequency with a similar increase in proportion for the decrease in frequency. At the relatively low portion of the RF spectrum, achieving resonance after a change in frequency does not present any difficulty that could not be solved by merely adding or removing a few turns from a coil or repackaging a capacitor. However at microwave frequencies, even short leads may present too much circuit inductance and therefore prevent achieving resonance.

Very short interconnecting wires between encapsulated components often serve as circuit elements of extremely small size in the microwave region. However, if the length of wire that can be utilized between one such component and the next is reduced to a very small fraction of the length incurred by carrying the circuit out of the encapsulating cartridge and completing it to an external element, then the device will be capable of utility at a considerably higher frequency than heretofore possible. I have found that by placing certain elements within the same encapsulation, greatly improved microwave characteristics are possible.

One of the most rewarding applications of my new concept appears in the field of parametric amplifiers. Parametric amplification refers to a class of amplifiers where amplification, at microwave frequencies, has been achieved, wherein the output power is derived from an A.C. input and derives its name from the fact that the differential equation governing the circuit behavior contains one or more reactive parameters which are non-linear or time-varying. (Harvey, "Microwave Engineering," 1963, p. 817.) When utilized at microwave frequencies, parametric amplifiers employ non-linear effects as a convenient means of obtaining the necessary time-varying reactance.

One such means of achieving the non-linear or time-varying effect is by the use of, for example, a varactor diode, or any other diode having voltage-dependent capacitance characteristics. If a P-N junction in a semiconductor body is biased in its reverse direction (re-reverse bias), it will be noted that a depletion layer is created having relatively few holes and electrons. Thus, the junction may be considered as behaving as a parallel-plate capacitance with its plates oppositely charged. However, when the reverse bias is increased, it is noted that the depletion layer widens bringing about a decrease in the capacitance and, hence, the junction may now be represented as a capacitor whose capacitance is operable of being varied in accordance with the applied bias voltage. In theory, the capacitance varies inversely with the applied voltage according to the square root law for abrupt junctions and the cube root law for graded junction diodes.

Progress in the varactor diode field is presently limited more by the parasitic reactances of the encapsulating cartridges than by the qualities of the best material. The main problem in the use of varactor diodes in parametric amplifiers is the provision of a broad band idler resonant circuit. A certain amount of inductance is necessary and desirable to resonate the effective capacitance of the varactor at the idler frequency. The required inductance for a desirably high idler frequency is, however, often less than the inductance inherent in the varactor package.

Therefore, in accordance with the principal embodiment of my invention, a simple loop of wire, contained within the encapsulated package, forms the idler resonant circuit at a very high frequency. This approach is particularly suited for an idler circuit, since as the name implies the signal that is circulated therein need not be withdrawn. A further advantage of this small idler inductance resulting from including the idler circuit within the package, is that a correspondingly larger capacitance may be used externally to resonate the given frequency, thus permitting a larger area junction to be used with a corresponding improvement in burn-out resistance. In this way, universal elements can be made whereby the idler frequency is approximately fixed but is useable over a wide range of signal frequency by proper selection of external inductance and capacitance.

It is therefore the principal object of the present invention to provide an assembly in which a diode, having voltage dependent capacitance characteristics, is capable of operating well at a considerably higher frequency than heretofore possible.

Another object of the present invention is to provide an assembly in which a diode, having voltage dependent capacitance characteristics, has the prior frequency determining elements included within the volume utilized to encapsulate the diode elements.

Still another object of the present invention is to provide a diode assembly, having voltage dependent capacitance characteristics, which due to its construction, is thereby provided with bandwith characteristics capable of accommodating broad input information bands, wide pump frequency variations and is less susceptible to temperature variations than heretofore possible.

Yet another object of the present invention is to provide an assembly in which a diode, having voltage dependent capacitance characteristics, is noted by the fact that is greatly simplifies circuit design requirements.

A further object of the present invention is to provide an assembly, having a diode with voltage dependent capacitance characteristics, that is easy to manufacture.

A still further object of the present invention is to provide an encapsulated assembly wherein a diode and an associated tuned circuit are enclosed within the encapsulation, and wherein the assembly has particular utility either as a parametric amplifier or as an oscillator or as a frequency multiplier.

According to the invention in one of its broader aspects, there is provided a semiconductor device, having particular utility in parametric amplifiers, oscillators, frequency multipliers and the like, with a built-in encapsulated idler circuit. Other conductors, to other connections in the semiconductor device, are separately exposed through the housing. According to another embodiment of the invention there is provided a balanced arrangement on a single semiconductor chip with a built-in idler circuit contained within the encapsulating housing.

The features of my invention which I believe to be novel are set forth with particularity in the appended claims. My invention itself, however, both as to its organization and method of operation, together with further objects and advantages thereof, can best be understood by reference to the following description of certain embodiments, taken in conjunction with the accompanying drawings, in which:

It should be here noted that similar elements in the different embodiments will bear similar reference numbers.

Figure 1A:
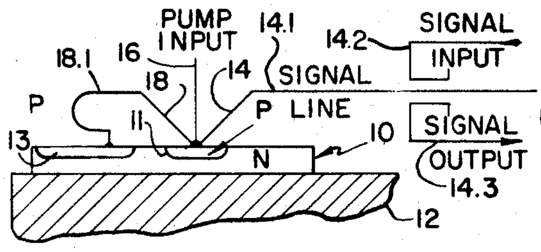
FIGS. 1A and 1B are schematic representations of two versions of an embodiment of a single junction parametric amplifier element with a built-in idler circuit.
Figure 1B:
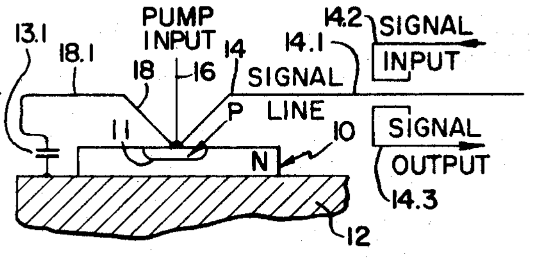

Referring now to FIGS. 1A and 1B for one embodiment indicating a single junction parametric amplifier, there is shown semiconductor chip 10 having P-type and N-type materials forming a diode junction 11 exhibiting voltage dependent capacitance characteristics (e.g. a varactor).

In this particular embodiment, the P-N junction semiconductor chip 10 is shown with the N-type material mounted on a metallic ground plane 12 and the P-type material provided with leads 14, 16 and 18. Lead 14 provides means for connection to a signal line, while lead 16 provides means for connecting the pump input signal to the device. Lead 18 provides means for connecting the idler circuit loop 18.1 to the device. In FIG. 1A the other end of the idler loop 18.1 is connected to semiconductor material 10, while in FIG. 1B the other end of the idler loop 18.1 is connected to the metal ground plane 12.

The incorporation of the idler circuit loop 18.1, in a device of this sort, necessitates some scheme for preventing a D.C. control bias from being short circuited.

One method of satisfying this requirement is to provide a blocking capacitor in series with the tuned circuit. In FIG. 1A this is accomplished by providing another P-N junction 13 functioning as a capacitor at the other (far) end of idler circuit loop 18.1, that has an area for example several times larger than that of the operating junction 11 to which the signal line 14 and the pump input line 16 are connected. If, however, the circuit requirements are such that the idler loop is to be connected to ground (e.g. to ground plane 12), then an appropriate series capacitor 13.1 is added as shown schematically in FIG. 1B.

Thus, in the parametric amplifier device shown in FIGS.

1A and 1B, the loop 18.1 and series blocking capacitor 13 or 13.1 represents the idler circuit, while separate leads 16 and 14 are shown for the pump and signal input lines respectively. It should also be noted that the separate leads for the signal and pump lines permit greater flexibility in adjusting these circuits and in particular, in designing filtering so that the pump frequency signal does not appear on the signal line 14. Inductance is usually required in the signal arm to tune the varactor capacitance. This inductance is usually much larger than the inductance associated with the idler circuit because the signal frequency is usually much lower than the idler frequency in the parametric amplifiers. Thus, it is now possible to use a substantial lead length for the signal line 14, and, if desired, even to add inductance in the signal path outside the line.

Having now completed the assembly, the signal line 14.1 may, for example, be made an appropriate length depending upon the frequency, and a signal input circuit 14.2 coupled thereto. Similarly, a signal output circuit 14.3 is also coupled to the signal line to derive an amplified output signal therefrom in a known parametric amplifier fashion.

Figure 1C:
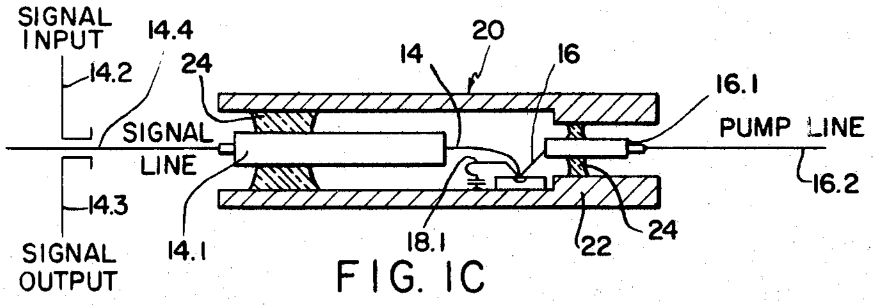
FIG. 1C is a section through a coaxial parametric amplifier element with a built-in idler circuit inductance according to FIG. 1B.

Referring now to FIG. 1C there is shown an arrangement of this embodiment of my invention indicating its applicability in coaxial line operation. In this figure, a cartridge 20 is shown having a metallic ground or shell portion 22 within which my diode configuration is mounted. The semiconductor chip is shown having the leads 14, 16 and 18.1 representing the signal line, the pump line and the idler loop, respectively, each connected at one end to the P-type material as previously described with regard to FIG. 1B. While the other end of idler loop 18.1 is connected to shell 22 via a capacitor 13.1, it may also be connected to the semiconductor chip 10 via a second P-N junction as per FIG. 1A. In this figure, the signal lead 14 is connected to a larger diameter termination 14.1 while the pump lead 16 is connected to a larger diameter termination 16.1 so that they may be properly inserted in a coaxial line. With a suitable encapsulating material 24 enclosing the terminations 14.1 and 16.1, the larger diameter wires can now be connected to the center conductor of a coaxial transmission line. In this instance, signal line 14.4 connected to termination 14.1 is provided with an appropriate length to that when input coupling means 14.2 and output coupling means 14.3 are electromagnetically coupled thereto, there is provided a convenient means for coupling the signal in and out. Similarly, line 16.2, which may be the center conductor of a transmission line, is connected to the termination 16.1 for providing the appropriate pump signal to the device.

Figure 1D:
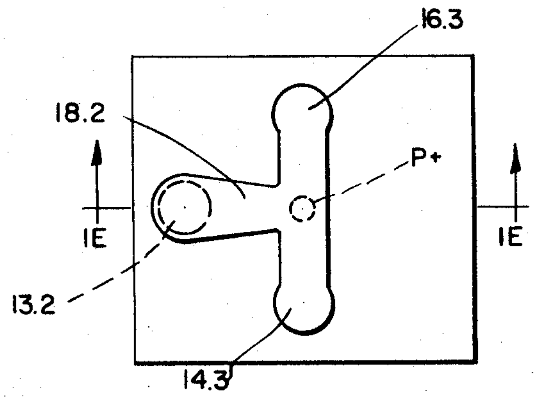
FIGS. 1D and 1E are plan and sectional views of another arrangement of my invention utilizing a laminated or monolithic construction.
Figure 1E:
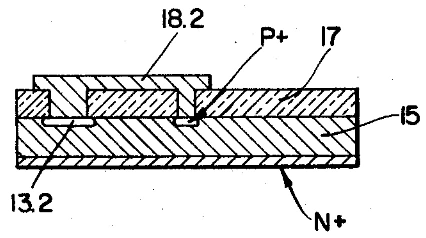

Utilizing the principal previously set forth in FIGS. 1A, 1B and 1C with regard to a single-junction amplifier element having an integrated idler loop circuit, reference is now made to FIGS. 1D and 1E which show another arrangement of this embodiment of my invention utilizing a monolithic or laminated construction that has particular utility in a high vibration environment where leads extending from the junction might be undesirable. In this embodiment, an intrinsic semiconductor material 15 has an N+ type material, for example, deposited on one side thereof and on the other side thereof has a switching or operating junction P formed between P+ material and the intrinsic material 15, and comparable to the P junction in FIGS. 1A, 1B and 1C. Similarly, a D.C. bias blocking device 13.2, is a device which may be a capacitor as represented by another P-type junction having an area several times larger than the operating junction P. An insulating layer 17, appropriately masked, and which may be glass, is provided over the intrinsic semiconductor material 15 and in part over junctions P+ and 13.2. The connection from one junction to the other is then provided over the layer 17 by means of a metallic connector 18.2 which is supported on the insulating layer 17 and which also forms the idler loop. Similarly, as described in the previous figures, the input or pump signal may be connected to tab 16.3, while the signal output may be derived from tab 14.3, both of which are ohmically connected to switching or operating junction P+. In this example, as in the previous examples, as well as the remaining examples of "single junction" embodiments of the invention is should be noted that while two junctions are utilized, one junction (13.2) performs the function of a blocking capacitor while the other junction (P+), the switching or operating junction, is a diode that has the voltage dependent characteristics relied upon to produce either parametric amplification, oscillation, frequency multiplication or mixing, etc.

The discussion so far has been described in terms of the utility of my invention in a parametric amplier. It will be recognized by those skilled in the art that, for example, varactor multipliers other than doublers, also require so-called "idler" circuits for efficient operation, which idler circuits may be included in the encapsulation in accordance with the principles of my invention. However, it is well known that while idler circuits must be predominantly reactive when used in a frequency multiplier configuration, an idler circuit in a parametric amplifier must be dissipative. Although both circuits are given the same name, the function of each circuit in its different configuration is almost distinct enough to be mutually exclusive. However, the qualitative features of the arrangement shown in FIG. 1A, for example, are also applicable to frequency multipliers. In a multiplier configuration the loop, together with the average junction elastance of the junction (11), should be resonant at the second harmonic in a tripler or quadrupler configuration. The optimum source and load impedances would thus tend to be independent of the series resistance as long as the resistance was maintained sufficiently small. This relationship represents the basic difference between the parametric amplifier (dissipative idler loop) and the multiplier (reactive idler loop) where, in the parametric amplifier case, the single-frequency impedance is a first-order open series resonance.

Figure 2A:
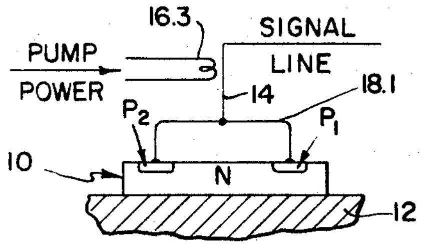
FIG. 2A is a schematic representation of a balanced parametric amplifier element on a single semiconductor chip with a built-in idler circuit.
Figure 2B:
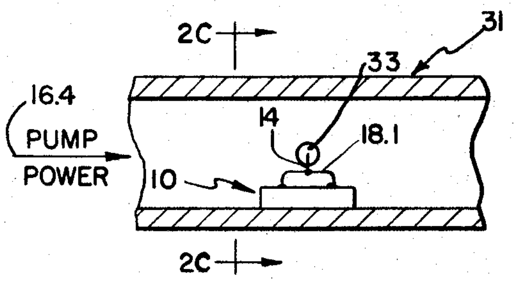
FIGS. 2B and 2C are side and end sections, respectively, of a waveguide showing the use of the balanced parametric amplifier element in a pumped waveguide.
Figure 2C:
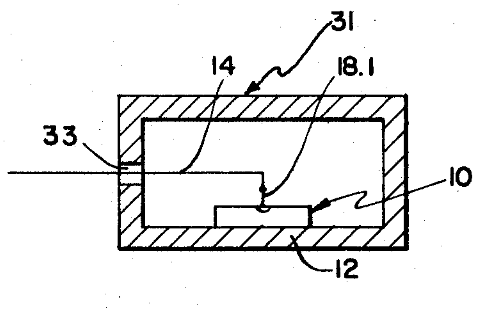

Referring now to FIG. 2A, there is shown a balanced parametric amplifier element employing a dual-varactor diode. In this embodiment, the semiconductor chip 10 is comprised of a pair of junctions between two P type portions $P_1$ and $P_2$ embedded in a portion of N type material with the N type material mounted on a ground plane 12. As in the previous embodiment, an idler loop 18.1 is provided but, in this instance, the idler circuit is formed by the loop (18.1) that extends directly from one P type portion to the other P type portion both junctions now being operating junctions. As in the case of the single varactor arrangements previously described in connection with FIGS. 1A–1E, this loop may also be made very small and may be contained entirely within the encapsulation of the entire assembly. In the balanced arrangement of the present embodiment the signal line 14 is connected to a point in the idler loop intermediate its ends, and the pump is coupled to the signal line at 16.3. The idler and the pump frequencies are prevented from exciting the signal line 14 by the symmetry of the configuration. While no filtering is ordinarily necessary to achieve the basic amplification action of the device, filters may, if necessary, be added to reduce any leakage arising from imperfections in the symmetry. As in the embodiment described above, the signal line in the balanced parametric amplifier embodiment is completely analogous to the signal line in the single diode embodiment and may have either a designed inductance value or an added external inductance when the signal frequency is sufficiently low. The coupling of the pump in this situation is schematically indicated by coupling coil 16.3 coupled to the signal line 14. In a general sense, one can always couple a high frequency by means of such a loop structure and, reference is now made to FIGS. 2B and 2C for a particular configuration adapted for use in a waveguide.

The balanced parametric amplifier element is shown mounted in a pumped waveguide 31 where it will be seen that the semiconductor element is mounted in this case on one broad wall of the waveguide which would constitute the ground plane 12. Idler loop 18.1 is connected from one junction to the other ($P_1$ to $P_2$, FIG. 2A). One end of signal line 14 is then connected to the center of the idler loop and the other end extends through aperture 33 in one narrow wall of the waveguide. Thus, when the pump power is launched down the waveguide in the direction indicated by arrow 16.4, there will be electromagnetic coupling to the signal line 14 thereby achieving all the necessary requirements for parametric amplification.

Figure 2D:
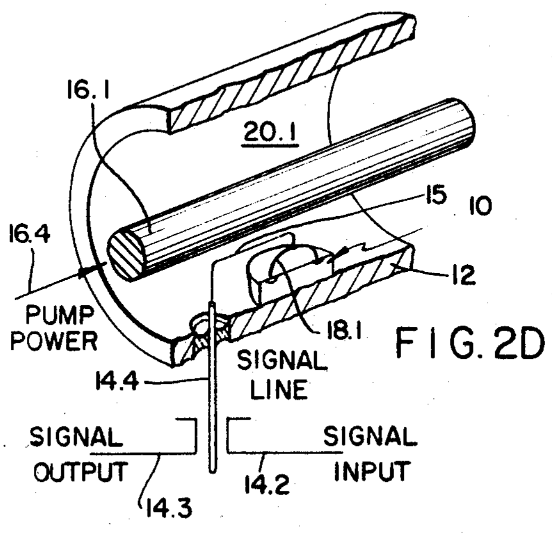
FIG. 2D is a sectional view of the balanced parametric amplifier element mounted in a pumped coaxial line.

Reference is now made to FIG. 2D for a variation of this general embodiment showing how a balanced parametric amplifier element is utilized in a pumped coaxial line. In this embodiment the shell 12 constitutes the outer conductor while the lead 16.1 constitutes the inner conductor. Here too, the pump power is launched down the coaxial line 20.1 in the direction indicated by the arrow 16.4. The pump power is coupled to the varactor diode by means of loop 15 which has one end connected to the idler loop 18.1 and its other end connected to the signal line 14.4. Line 14.4 passes through shell 12 and serves as the signal line to which the signal input is coupled by means of line 14.2 and from which the output is taken by means of signal output line 14.3.

In the prior discussion of the balanced parametric amplifier configuration, it will be obvious to those skilled in the art that these arrangements provide relatively loose couplings and as a result, are extravagant in the use of pump power. These configurations are practical, and in fact very desirable in the design of, for example, phased array antenna systems wherein many parametric amplifiers are run from a single feed. In this case, since there is only loose coupling, the result is that there is a minimum of interaction between the various parametric amplifiers.

Figure 3A:
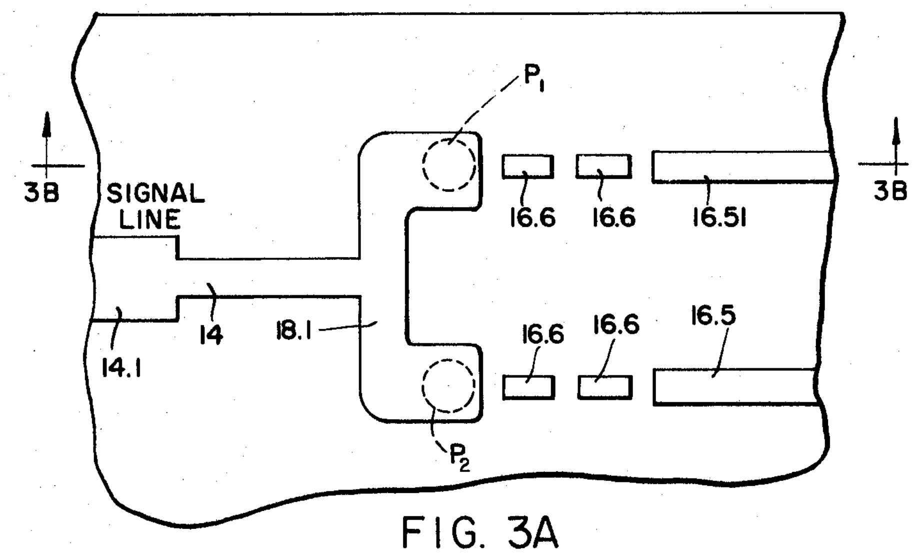
FIG. 3A is a schematic representation, in plan view, of a strip-transmission-line (laminated), balanced parametric amplifier element.
Figure 3B:
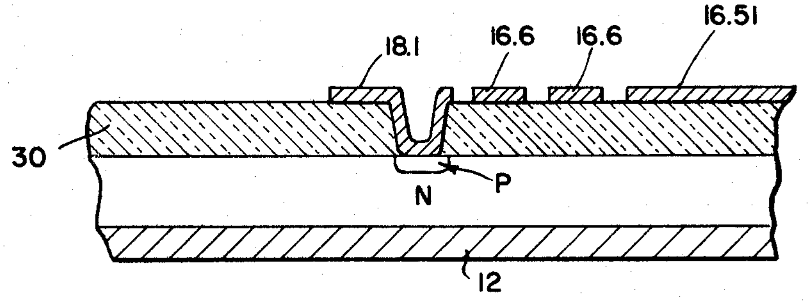
FIG. 3B is a side sectional view of a strip-transmission-line parametric amplifier, taken along lines 3B—3B of FIG. 3A.

There are, however, many existing applications where only one, or relatively few parametric amplifiers are involved and as a result, tighter coupling is more desirable. This kind of coupling can be achieved by direct means such as shown in FIGS. 3A and 3B. In this embodiment, a monolithic or laminated construction, strip-transmission-line filter circuit is used and interaction of the pump with the idler circuit is thus achieved by standard techniques. It should be noted, however, that this construction is, of course, applicable to all of the previously discussed techniques and is convenient for economy of fabrication, uniformity of products and avoidance of microphonics. In this embodiment, N type material is deposited over a metal substrate 12. Appropriate portions of P type material, indicated at $P_1$ and $P_2$ are located in the N type material. Thereafter, dielectric material 30 is placed over the N and P type materials. A balanced pump input, shown as balanced lines 16.5 and 16.51, is coupled to the idler strap 18.1 by means of strip-transmission-line filter elements 16.6 in the well known manner. The signal line 14.1 is then connected to idler strip 18.1 by means of lead 14. In essence, this last embodiment is based on the principle that a dielectric solid may be used in place of air as long as the dimensions of the elements are adjusted to take into account the dielectric constant of this solid material.

Figure 4:
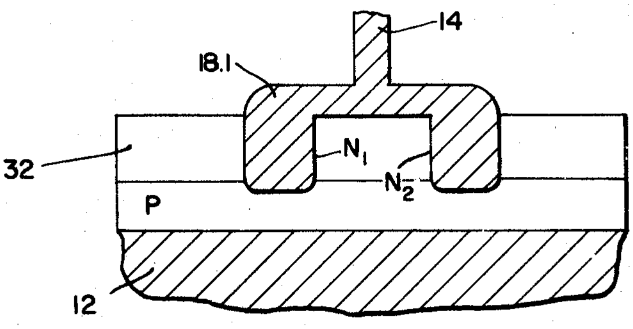
FIG. 4 is a schematic representation of a two-junction tunnel diode oscillator utilizing the principles of my invention.

Referring now to FIG. 4, there is shown a tunnel diode oscillator configuration which provides another simple and favorable case for the application of my two junction concept. The large capacitance per unit area of junctions which provide tunnelling action means that a very small amount of inductance will be required to resonate the junctions at high frequency. The use of a pair of junctions with an interconnecting strap to serve as a resonating inductance thus solves the problem of the magnitude of inductance with a minimum effort. The resistance between the two junctions and the semiconductor substrate is very small because of the low resistivity of the substrate. In this configuration, a P type material is deposited on a base 12. The N type material, which may be tellurium-doped lead, is used to form the junctions $N_1$ and $N_2$. A layer of semi-insulating material 32, which may for example be gallium arsenide, is disposed over the P type material around the portions of N type material. The loop inductor 18.1 is joined to the N type material sections outside the semi-insulating layer 32, and the output from the loop inductor 18.1 is accomplished by means of lead 14. It should be noted that this configuration will oscillate at the frequency determined by the inductance of the loop 18.1 and the capacitance of the junctions at $N_1$ and $N_2$, if biased to the negative resistance region of the tunnel diode characteristics.

While I have described what are presently considered certain preferred embodiments of my invention, it will be obvious to those skilled in the art that various changes and modifications may be made without departing from the inventive concept contained herein and, it is therefore aimed in the appended claims to cover all such other changes and modifications that fall within the true spirit and scope of my invention.

What is claimed is:

1. A semiconductor device intended for operation with signals in a first range of frequencies comprising: a body of semiconductor material and at least one diode-rectifying entity physically and operatively associated therewith, said entity having voltage-dependent capacitance characteristics when subjected to reverse bias; signal conductor means coupled to said device; and a series tuned circuit connected essentially in shunt with said entity, and located in close proximity to said body; said circuit being tuned to a frequency in a range higher than said first range of frequencies and having a physical size which is approximately the same size as said body, whereby optionally said tuned circuit can be contained entirely within an envelope for said device, or be made integral with said body.

2. A device according to claim 1 in which said tuned circuit is integral with said body.

3. A device according to claim 2 in which said body has an essentially insulating stratum on a surface, and said circuit includes a tuned-circuit conductor affixed to said stratum, said tuned circuit conductor constituting essentially the inductance of said tuned circuit.

4. A device according to claim 1 including means forming a second rectifying entity physically and operatively associated with said body, said tuned circuit including said second entity as the essential capacitance thereof.

5. A device according to claim 1 in which an envelope encloses said body and said tuned circuit, with said signal conductor means passing through said envelope.

6. A device according to claim 1 including additional separate conductor means joined to said device for the application of pump frequency power to said device.

7. A device according to claim 1 in which said body is affixed to an electrically conductive member, and said tuned circuit is comprised of an electrical conductor and a capacitor joined in series across said entity via said conductive member, said conductor constituting the inductance of said tuned circuit at said higher frequency.

8. A device according to claim 1 in which said entity is a junction between dissimilar materials which are respectively regions of P-type and N-type semiconductor materials, with said tuned circuit conductor means ohmically joined to said P-type region.

9. A semiconductor device according to claim 1 in which: two diode-rectifying entities are separately physically and operatively associated with said body, said body providing a common electrode for one side of each of said entities, each said entity having voltage-dependent capacitance characteristics when subjected to reverse bias; said tuned circuit including a conductor connected from one to the other of the non-common electrodes of said entities and constituting the essential inductance of said tuned circuit; signal conductor means being coupled to said tuned-circuit conductor at a region intermediate the ends thereof.

10. A device according to claim 9 in which said rectifying entities are junctions in said body between regions of dissimilar types of semiconductor materials, said common electrodes being of one said type and said non-common electrodes being dissimilar thereto, and said tuned circuit conductor is integral with said body.

11. A device according to claim 10 in which said body has an essentially insulating stratum on a surface of said body, said stratum being apertured to allow ohmic-contact access to said non-common electrodes, and said tuned circuit conductor being affixed to said stratum and making ohmic contact at its ends, respectively, to said non-common electrodes.

12. A device according to claim 11 in which said signal conductor means is affixed to said stratum and is integrally joined at one end to said tuned circuit conductor.

13. A device according to claim 9 in which said signal conductor means is ohmically connected to the mid-point of said tuned circuit conductor.

14. A device according to claim 9 including an envelope in the form of a section of transmission line having conductive walls surrounding said body and said tuned circuit for enclosing same and supplying pump power thereto, with said signal conductor means passing through a wall of said transmission line.

15. A semiconductor device comprising:

a pair of dissimilar materials arranged to form a rectifying barrier therebetween, the barrier having voltage dependent capacitance characteristics;

coaxial housing means having a pair of center conductors and an outer shell;

the outer shell enclosing the center conductors and the dissimilar materials;

a plurality of conductive connectors each joined at one end thereof to one of the dissimilar materials and joined at the other end thereof to a respective center conductor;

the other of the dissimilar materials being mounted on the outer shell at the inside thereof; and a tuned circuit element, disposed within the housing means, and connected from the one to the other of the pair of dissimilar materials.

References Cited

UNITED STATES PATENTS

| | | | |
|---|---|---|---|
| 3,127,566 | 3/1964 | Lombardo | 330—4.9 |
| 3,230,464 | 1/1966 | Grace | 330—4.9 |
| 3,293,447 | 12/1966 | Fleming | 330—4.9 |

ROY LAKE, *Primary Examiner.*

DARWIN R. HOSTETTER, *Examiner.*